United States Patent
Giridharan et al.

(10) Patent No.: US 9,240,912 B1
(45) Date of Patent: Jan. 19, 2016

(54) TRANSCEIVER CIRCUITRY WITH SUMMATION NODE COMMON MODE DROOP REDUCTION

(71) Applicant: Altera Corporation, San Jose, CA (US)

(72) Inventors: Vishal Giridharan, San Jose, CA (US); Allen K. Chan, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/555,035

(22) Filed: Nov. 26, 2014

(51) Int. Cl.
*H04L 25/04* (2006.01)
*H04L 25/03* (2006.01)
*H03F 3/45* (2006.01)
*H04L 25/06* (2006.01)

(52) U.S. Cl.
CPC ...... *H04L 25/03057* (2013.01); *H03F 3/45076* (2013.01); *H04L 25/06* (2013.01); *H03F 2200/471* (2013.01); *H03F 2203/45221* (2013.01)

(58) Field of Classification Search
None
See application file for complete search history.

(56) References Cited

U.S. PATENT DOCUMENTS

| | | | |
|---|---|---|---|
| 5,283,811 A | 2/1994 | Chennakeshu et al. | |
| 7,170,438 B2 | 1/2007 | Jaussi et al. | |
| 7,443,913 B2 | 10/2008 | Bhakta et al. | |
| 7,924,912 B1 | 4/2011 | Rokhsaz et al. | |
| 8,626,474 B2 | 1/2014 | Li et al. | |
| 8,638,150 B2 | 1/2014 | Kim et al. | |
| 2002/0050861 A1* | 5/2002 | Nguyen et al. | 330/254 |
| 2005/0030085 A1* | 2/2005 | Jankowski et al. | 327/427 |
| 2007/0229158 A1* | 10/2007 | Mojarradi et al. | 330/253 |
| 2009/0020517 A1* | 1/2009 | Ito et al. | 219/210 |
| 2011/0187410 A1* | 8/2011 | Kato et al. | 326/46 |
| 2012/0062316 A1* | 3/2012 | Huang et al. | 330/69 |
| 2012/0141122 A1* | 6/2012 | Carusone et al. | 398/37 |
| 2014/0269889 A1* | 9/2014 | Xu et al. | 375/233 |
| 2014/0281845 A1* | 9/2014 | Cyrusian | 714/819 |
| 2014/0312945 A1* | 10/2014 | Ippili et al. | 327/157 |

OTHER PUBLICATIONS

Chan et al., U.S. Appl. No. 14/536,417, filed Nov. 7, 2014.
Mendel et al., U.S. Appl. No. 13/862,305, filed Apr. 12, 2013.

* cited by examiner

*Primary Examiner* — Leon-Viet Nguyen
(74) *Attorney, Agent, or Firm* — Treyz Law Group; Jason Tsai

(57) ABSTRACT

An integrated circuit having transceiver circuitry is provided. The transceiver circuitry may include an equalization circuit such as a decision feedback equalizer (DFE). The DFE may include a variable gain amplifier (VGA) that is coupled to a summation node circuit and a digital sampler. The DFE may also include an operational amplifier that is coupled in a negative feedback loop and that provides a controlled power supply voltage to the VGA so that the VGA is able to provide a stable common mode output voltage to the digital sampler. The operational amplifier may be a self-biased operational amplifier with an output stage that includes miller compensation circuitry for enhanced stability.

15 Claims, 4 Drawing Sheets

TRANSCEIVER CIRCUITRY WITH SUMMATION NODE COMMON MODE DROOP REDUCTION

BACKGROUND

This relates generally to communications links, and more particularly, to high-speed input-output (I/O) communications links.

A typical communications link includes a transmitter (TX) module, a receiver (RX) module, and a channel that connects the TX module to the RX module. The TX module transmits a serial data bit stream across the channel to the RX module. Typical high-speed transmit data rates can be as high as 10 Gbps (gigabits per second) or more. Communications links operating at such high data rates are often referred to as high-speed serial links or high-speed I/O links.

Oftentimes, the RX module includes a decision feedback equalizer (DFE) that is used to provide equalization for analog signals which may have been degraded when being transmitted through a band limited channel (i.e., by attenuating low frequency components or boosting high frequency components). Consider a conventional decision feedback equalizer that includes an amplifier that is coupled to multiple differential pairs serving as delay taps. This type of equalizer is capable of canceling out inter-symbol interference (ISI) by summing an input signal at discrete time intervals with a weighted sum of the previously sampled values, which are being fed back as delay tap coefficients.

The differential pairs may therefore implement a current summation operation for the equalizer. The summed current is provided to a load resistance, thereby generating a summed voltage at a DFE summation node. The DFE summation node is fed to an input of a digital sampler. For proper operation of the digital sampler, a sufficiently high input common mode voltage is required. When the magnitude of the tap coefficients are large, the use of multiple differential pairs may result in a reduction in the digital sampler input common mode voltage and can substantially degrade the performance of the decision feedback equalizer.

SUMMARY

A communications link may include transmit (TX) circuitry, receive (RX) circuitry, and a channel that links the TX and RX circuitry. The TX and RX (transceiver) circuitry may include an equalization circuit such as a decision feedback equalizer (DFE).

The DFE may include a differential amplifier having a power supply terminal and an output and an operational amplifier having an input that receives a common mode sensing voltage from the output of the differential amplifier and an output that is coupled to the power supply terminal of the differential amplifier. The operational amplifier may also include an additional input that receives a reference voltage level. Coupled in this way, the operational amplifier may serve to ensure that the common mode output voltage level of the differential amplifier matches with the received reference voltage level.

The DFE may also include a digital sampler that receives signals from the output of the differential amplifier and a summation node circuit that is coupled to the output of the differential amplifier. The summation node circuit (e.g., a current summation node circuit) may have inputs that receive data from the output of the digital sampler and from one or more digital flip-flops that may be coupled to the output of the digital sampler.

The operational amplifier may be a self-biased operational amplifier. The operational amplifier may include a single-ended amplifier and a biasing circuit that receives the common mode voltage level from the differential amplifier and that biases the single-ended amplifier via a current mirroring configuration. The operational amplifier may also include an output stage having miller compensation circuitry that ensures stability of the negative feedback loop in which the operational amplifier is coupled to the differential amplifier.

Further features of the present invention, its nature and various advantages will be more apparent from the accompanying drawings and the following detailed description.

DETAILED DESCRIPTION

This relates to communications links, and more particularly to equalization circuits that are capable of operating at desired summation node common mode voltage levels. It will be recognized by one skilled in the art, that the present exemplary embodiments may be practiced without some or all of these specific details. In other instances, well-known operations have not been described in detail in order not to unnecessarily obscure the present embodiments.

Communications links are commonly used to transport data between separate integrated circuits packages, printed circuit boards, etc. Such communications links may be used to connect integrated circuits that include communications capabilities, such as memory chips, digital signal processing circuits, microprocessors, application specific integrated circuits, programmable logic device integrated circuits, field-programmable gate arrays, application specified standard products, or any other suitable integrated circuit.

Figure 1:
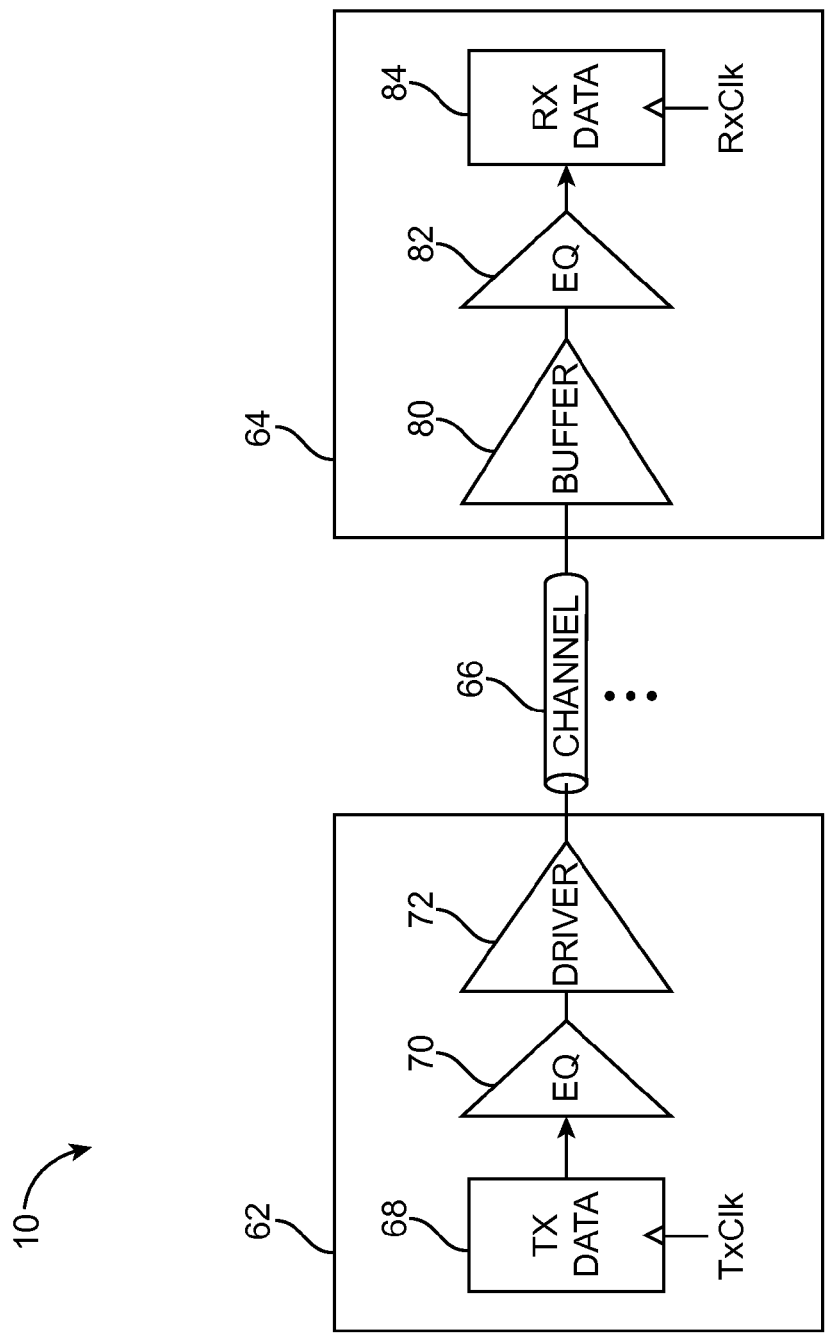
FIG. 1 is a circuit block diagram of an illustrative communications link in accordance with an embodiment of the present invention.

A high-speed link might, as an example, carry data at 10 gigabits per second or more. A high-speed communications system 10 is shown in FIG. 1. Communications system 10 may include transmitter (TX) circuitry such as TX circuitry 62, a channel such as channel 66, and receiver (RX) circuitry such as RX circuitry 64. Channel 66 may connect TX circuitry 62 to RX circuitry 64 (e.g., circuitry 62 may produce data that is to be transmitted to circuitry 64 over link 66).

TX circuitry 62 may be formed on a first integrated circuit while RX circuitry 64 may be formed on a second integrated circuit (as an example). Integrated circuit devices 62 and 64 may be mounted on a printed circuit board (PCB). Transmitter device 62 may convey data to RX circuitry 64 through channel 66. If desired, more than one channel may be used to link TX circuitry 62 to RX circuitry 64.

In general, channel 66 may be formed from any suitable physical transmission medium. Examples of transmission paths that may be used in channel 66 include differential signaling paths made up of pairs of conductive wires, coaxial cable paths (e.g., a CAT 5 cable), fiber optic cable paths, traces on printed circuit boards, combinations of such paths, backplane connectors, or other suitable communications link paths. In a typical system, integrated circuits 62 and 64 may be mounted on one or more circuit boards and channel 66 may involve transmission line structures fabricated on the circuit board or boards.

This example is merely illustrative. Communications link of the type described in connection with FIG. 1 may be used provide data transport between integrated circuits, printed circuit boards, circuits within a single integrated circuit, systems, etc.

TX circuitry 62 may include a TX data source such as data source 68, a TX equalizer circuit such as equalizer 70, and a TX driver such as driver 72. Data source 68 may provide data to be transmitted and may be controlled by a transmit clock signal TxClk. Clock signal TxClk may be generated by an off-chip oscillator circuit or an on-chip phase-locked loop circuit (as examples). Data source 68 may be a parallel-in serial-out (PISO) data circuit or a serializer circuit that provides TX circuitry 62 with a serial data bit stream for transmission.

Equalizer 70 may receive data from data source 68. Equalizer 70 may be used to provide high-frequency and direct signal level boosting to compensate for high-frequency signal loss commonly seen in high-speed serial links (e.g., losses in copper-based channels that exhibit undesired low-pass transfer characteristics that result in signal degradation at high data rates) or to enhance signal to noise ratio (SNR) in scenarios in which uncorrelated noise such as crosstalk is present. Equalizer 70 may implement linear equalization schemes such as finite impulse response (FIR) and feed forward equalization (FFE) schemes or nonlinear adaptive equalization schemes such as infinite impulse response (IIR) or decision feedback equalization (DFE) schemes (as examples).

Equalizer 70 may output equalized signals to transmit driver 72. Driver 72 may have an output that is connected to a first terminal of channel 66. The output of driver 72 may have an output differential resistance of 10 Ohms to provide impedance matching with channel 66 (e.g., assuming the first terminal of channel 66 has an input differential resistance of 10 Ohms). Impedance matching may provide maximum signal power transfer from driver 72 to channel 66 and may eliminate signal reflection. Driver 72 may be used to provide sufficient drive strength to drive the data stream across channel 66. In general, driver 72 may be configured to exhibit any suitable output impedance that matches with the corresponding impedance of channel 66.

Channel 66 may have a second terminal that is connected to RX circuitry 64. Receive circuitry 64 may include an RX buffer such as buffer 80, an RX equalizer such as equalizer 82, and a data latching circuit 84. In the example of FIG. 1, the second terminal of channel 66 may be connected to an input of buffer 80. Buffer 80 may receive data from channel 66. Buffer 80 may have an input differential resistance of 10 Ohms for impedance matching (i.e., assuming the second terminal of channel 66 has an output differential resistance of 10 Ohms). Buffer 80 may provide additional pre-amplification for the received data, if desired.

Buffer 80 may output the received data to equalizer circuit 82. Equalizer 82 may provide further high-frequency boosting or direct signal level boosting to compensate for any additional undesired high-frequency signal loss commonly seen in high-speed serial links (e.g., losses in copper-based channels that exhibit undesired low-pass transfer characteristics that result in signal degradation at high data rates). Similar to the TX equalizer, RX equalization circuit 82 may implement linear equalization schemes such as finite impulse response (FIR) and feed forward equalization (FFE) schemes or nonlinear adaptive equalization schemes such as infinite impulse response (IIR) or decision feedback equalization (DFE) schemes (as examples).

Equalizer 82 may output the received data that has been equalized to RX data latch 84. Data latch (or source) 84 may be a serial-in parallel-out (SIPO) or a de-serializer data circuit (as an example). In this example, data source 84 may convert the serial data bit stream to parallel data for later processing.

All the components of system 10 in FIG. 1 (e.g., equalizers 70 and 82, driver 72, channel 66, and buffer 80) may be implemented using single-ended or differential signaling architectures. For example, equalizers 70 and 82 may have differential inputs and differential outputs instead of single-ended inputs and outputs, and the data transmitted over channel 66 may be in the form of differential signals.

Figure 2:
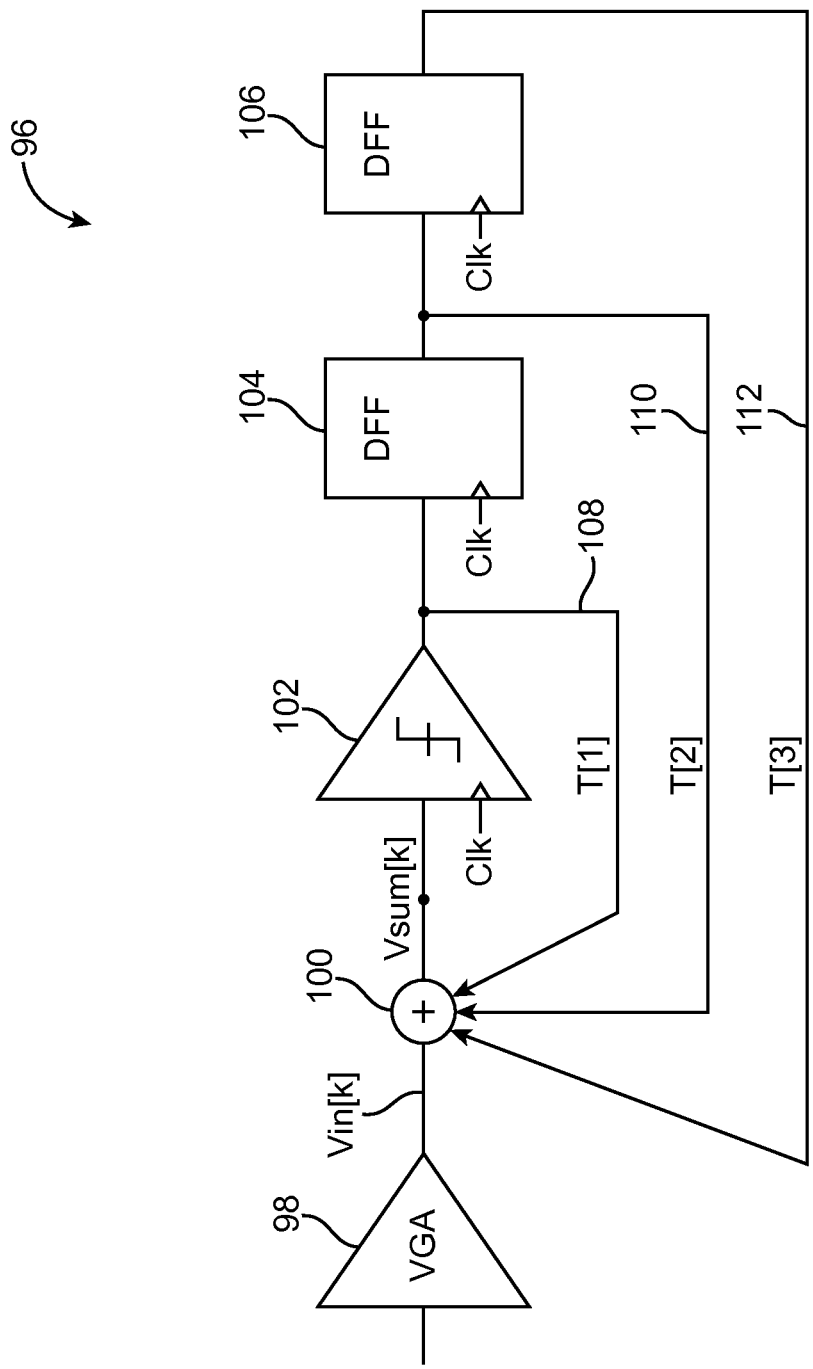
FIG. 2 is a diagram of an illustrative decision feedback equalizer circuit in accordance with an embodiment of the present invention.

FIG. 2 is a diagram of an illustrative equalization circuit such as a decision feedback equalizer (DFE) circuit 96. Circuit 96 may, for example, be used as a receiver equalizer 82 (FIG. 1). This is, however, merely illustrative. If desired, the transmit equalizer 70 of FIG. 1 can also be implemented using the configuration shown in FIG. 2.

As shown in FIG. 2, DFE circuit 96 may include an analog amplifier circuit such as a variable gain amplifier (VGA) 98, a DFE summation node circuit 100, a digital sampler circuit such as sampler 102, a first digital flip-flop (DFF) 104, and a second digital flip-flop 106. The variable gain amplifier 98 may sometimes be considered as part of buffer 80 (i.e., assuming circuit 96 is used as the equalization circuit for receiver circuitry 64) and can be used to provide preamplification for received signals prior to being sampled by circuit 102. Variable gain amplifier 98 may have an output on which amplified analog signal Vin[k] is provided.

Summation node circuit 100 may have an input that receives the amplified analog signal Vin[k] from VGA 98, additional inputs that receive weighted versions of previously sampled values (sometimes referred to as delay tap data values or delay tap coefficients), and an output on which a summation node voltage Vsum[k] is provided. The output of summation node circuit 100 is therefore sometimes referred to as the DFE summation node.

Sampler 102 (sometimes referred to as a digital "slicer") may serve as a high gain flip-flop or a comparator that converts Vsum[k], which is an analog signal, to its digital equivalent. Sampler 102 may include a sense amplifier circuit coupled in series with a set-reset latch (as an example). If desired, other suitable implementations of digital sampler may be used for resolving small voltage differences at the summation node (assuming Vsum[k] is a differential signal).

Sampler 102, first DFF 104, and second DFF 106 may be coupled in series in the arrangement as shown in FIG. 2. Each of sampler 102, DFF 104, and DFF 106 may be controlled by clock signal Clk. Coupled in this way, the data latched at the output of sampler 102 may represent data that was sampled by circuit 102 in a previous clock cycle (i.e., received data that has been delayed by one clock cycle or one "tap"); whereas the data latched at the output of DFF 104 may represent sampled data that has been delayed by two taps; and whereas the data latched at the output of DFF 106 may represent sampled data that has been delayed by three taps.

These delayed data signals may be fed back to the summation node circuit 100. In particular, the output of sampler 102 may be coupled to a first additional input of summation node circuit 100 via path 108; the output of first DFF 104 may be coupled to a second additional input of summation node circuit 100 via path 110; and the output of second DFF 106 may be coupled to a third additional input of summation node circuit 100 via path 112. Connected in this way, the DFE circuit 96 of FIG. 2 represents a 3-tap full rate decision feedback equalizer.

The input of DFE circuit 96 may be a discrete time data sequence which can oftentimes be distorted due to inter-symbol interference (ISI) effects (e.g., due to band-limited characteristics associated with the channel, as described above). DFE circuit 96 of the type shown in FIG. 2 can effectively cancel out the ISI by summing the input signal Vin[k] that is received at any given point in time with a weighted sum of the previous values of the discrete time data sequence according to the following equation:

$$Vsum[k]=Vin[k]-\Sigma_{i=1}^{3} T[i] \times Din[k-i] \qquad (1)$$

where term Din[k−i] represents the polarity of the data i cycles before the current data at time k, and where time T[i] denotes the tap weight for tap i. Referring back to FIG. 2, T[1] represents the tap weight for the data provided at tap 1 (i.e., at the output of sampler 102); T[2] represents the tap weight of the data provided at tap 2 (i.e., at the output of DFF 104); and T[3] represents the tap weight of the data provided at tap 3 (i.e., at the output of DFF 106).

The example of FIG. 2 in which DFE circuit 96 includes three taps is merely illustrative and does not limit the scope of the present invention. In general, circuit 96 that is used as an equalization circuit may include less than three taps or more than three taps and can be implemented using any desired linear equalization scheme, nonlinear equalization scheme, schemes that involve feedback and/or feed forward paths, etc.

Figure 3:
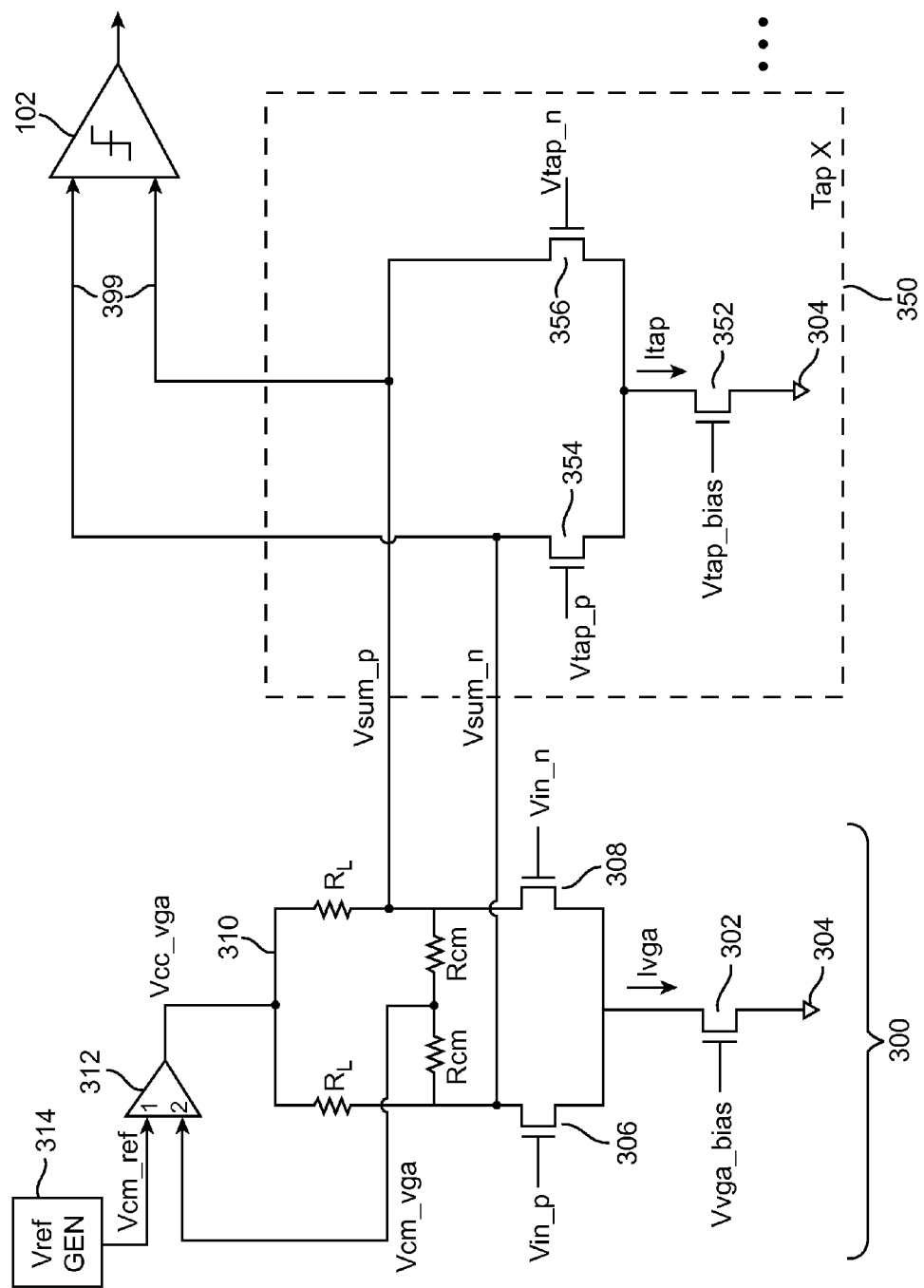
FIG. 3 is a circuit diagram of an illustrative variable gain amplifier, a summation node circuit, and an operational amplifier that is used to control the common mode voltage of the summation node circuit in accordance with an embodiment of the present invention.

FIG. 3 shows one suitable circuit implementation of the variable gain amplifier and the summation node circuit. As shown in FIG. 3, an amplifier 300 is coupled to a differential pair 350. Amplifier 300 may serve as the variable gain amplifier 98 in FIG. 2, whereas differential pair 350 may serve as part of the summation node circuit 100 of FIG. 2.

Variable gain amplifier (VGA) circuit 300 may include n-channel transistors 302, 306, and 308, and first and second load resistors $R_L$. In particular, transistor 302 may serve as a "tail" transistor of a differential pair amplifier having a drain terminal acting as the tail node for the differential pair amplifier, source terminal that is coupled to ground power supply line 304, and a gate terminal that receives bias voltage Vvga bias. Bias voltage Vvga bias may be adjusted to tune the amount of tail current Ivga flowing through transistor 302, which can directly affect the gain of VGA circuit 300.

Transistor 306 may have a drain terminal that is coupled to a controlled power supply terminal 310 of the differential pair amplifier 300 via the first resistor $R_L$, a source terminal that is coupled to the tail node, and a gate terminal that serves as the positive input terminal for amplifier 300 (i.e., the gate of transistor 306 may receive Vin_p). Transistor 308 may have a drain terminal that is coupled to controlled power supply terminal 310 via the second resistor $R_L$, a source terminal that is coupled to the tail node, and a gate terminal that serves as the negative input terminal for amplifier 300 (i.e., the gate of transistor 306 may receive Vin_n).

The drain terminal of transistor 308 may serve as the positive output of amplifier 300 on which positive sum signal Vsum_p is provided, whereas the drain terminal of transistor 306 may serve as the negative output terminal of amplifier 300 on which negative sum signal Vsum_n is provided. The difference between Vsum_p and Vsum_n may be equal to the Vsum[k] term of equation 1 (shown above). The summing voltage may be directly coupled to the input of digital sampler 102 via paths 399.

Differential pair circuit 350 may include re-channel transistors 352, 354, and 356. In particular, transistor 352 may serve as the tail transistor differential pair 350 having a drain terminal acting as the tail node, a source terminal that is coupled to ground line 304, and a gate terminal that receives bias voltage Vtap_bias. Bias voltage Vtap_bias may affect the amount of current Itap flowing through tail transistor 352.

Transistor 354 may have a drain terminal that is coupled to the drain terminal of transistor 306, a source terminal that is coupled to the tail node of differential pair 350, and a gate terminal that receives a positive tap input signal Vtap_p. Transistor 356 may have a drain terminal that is coupled to the drain terminal of transistor 308, a source terminal that is coupled to the tail node of differential pair 350, and a gate terminal that receives a negative tap input signal Vtap_n. The positive and negative inputs of differential pair 350 may serve to receive tap signals conveyed over feedback paths (e.g., paths 108, 110, and 112 of FIG. 2).

In the example of FIG. 3, only one differential pair 350 is shown. This is merely illustrative. In general, multiple instances of differential pair circuit 350 may be used depending on the number of taps that is required in the DFE circuit (e.g., a 3-tap DFE circuit may include at least three differential pairs 350 coupled in parallel to the output of amplifier 300; a four-tap DFE circuit may include at least four differential pairs 350 coupled in parallel to the output of amplifier 300; etc.).

Differential pair 350 configured in this way effectively switches current into one of two load resistive branches, thereby implementing a current summation operation for the summation node circuit (i.e., the summation node circuit 100 of FIG. 2). If desired, other ways of implementing a current summing operation may be used. If desired, a summation node circuit that implements a voltage summation operation can also be used instead of the current summation operation.

The coupling of differential pair 350 at the summation node may, however, reduce the common mode voltage of the summation node. The expression of the common voltage output voltage of amplifier 300 is shown in equation 2:

$$Vsum\_cm = \left[ Vcc - \frac{1}{2} Ivga \times R_L \right] - \left[ \frac{1}{2} \sum_{i=1}^{N} Itap[i] \times R \right] \qquad (2)$$

As shown in equation 2, larger tap currents will result in a reduction of the common mode output voltage Vsum_cm. As shown in FIG. 3, the output of amplifier 300 is directly fed to sampler 102 to make digital comparisons. Digital sampler 102 typically requires a sufficiently high input common mode voltage in order to perform satisfactorily. Any common mode voltage reduction at the DFE summation node may therefore be detrimental to the operation of sampler 102, which can hamper the performance of the entire DFE circuit.

In accordance with an embodiment of the present invention, an operational amplifier such as operational amplifier 312 (FIG. 3) may be used to control the common mode voltage at the DFE summation node. As shown in FIG. 3, amplifier 312 may have a first input that receives a reference voltage Vcm_ref from a reference voltage generator 314 (e.g., an on-chip voltage regulator), a second input that is coupled to the drain terminals of transistors 306 and 308 via first and second resistors Rcm, and an output on which a controlled power supply voltage Vcc_vga is fed to power supply terminal 310.

In particular, the first resistor Rcm may have a first terminal that is coupled to the drain terminal of transistor 306 and a second terminal. The second resistor Rcm may have a first terminal that is coupled to the drain terminal of transistor 308 and a second terminal that is coupled to the second terminal of first resistor Rcm. A sensing common mode voltage Vcm_vga may be provided at the second terminals of resistors Rcm, which is fed to the second input of operational amplifier 312.

Connected in this closed negative feedback loop, the sensed common mode voltage Vcm_vga may be compared to the reference voltage Vcm_ref and may output a corresponding Vcc_vga so that the common mode voltage of the summation node matches with reference voltage Vcm_ref. In other words, operational amplifier 312 will drive Vcc_vga to the desired level to prevent the summation node common mode voltage from drooping or deviating from the desired voltage level (e.g., amplifier 312 provides a corresponding output Vcc_vga that ensures that the common mode voltage level at the summation node is within a predetermined range of voltage levels).

The reference voltage Vcm_ref may, in general, be set equal to the desired common mode input voltage of digital sampler 102 (e.g., Vcm_ref may be set to a level that optimizes the performance of sampler circuit 102). Generator 312 (e.g., an on-chip voltage generator or an off-chip voltage generator) may be configured to set Vcm_ref equal to 0.7 V (as an example). If desired, Vcm_ref may be set to less than 0.7 V, more than 0.7 V, or other suitable voltage levels that maximizes the performance of the entire DFE circuit.

Figure 4:
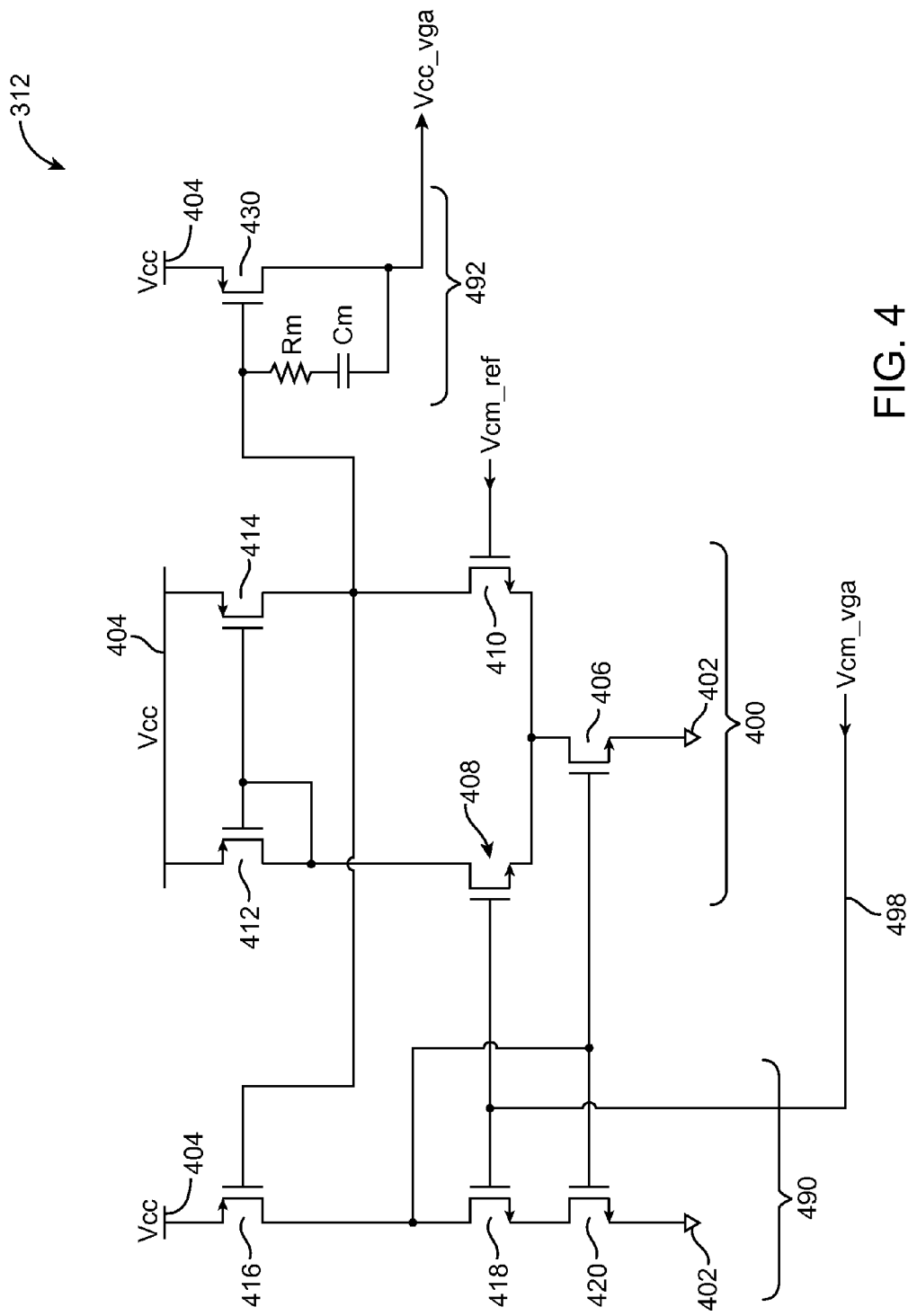
FIG. 4 is a circuit diagram of an illustrative self-biased operational amplifier that may be used to control the common mode voltage of a summation node circuit of the type shown in FIG. 3 in accordance with an embodiment of the present invention.

In accordance with another embodiment, FIG. 4 shows one suitable circuit implementation of operational amplifier 312. As shown in FIG. 4, amplifier circuit 312 may include a single-stage amplifier 400 that is coupled to a biasing circuit 490, and an output circuit 492. Single-stage amplifier 400 may include n-channel transistors 406, 408, and 410 and p-channel transistors 412 and 414.

In particular, transistor 406 may serve as the tail transistor having a drain terminal acting as the tail node, a source terminal that is coupled to ground 402, and a gate terminal that receives a voltage from biasing circuit 490. Transistor 408 may have a drain terminal that is coupled to positive power supply terminal 404 (e.g., a power supply terminal on which positive power supply voltage Vcc is provided) via load transistor 412, a source terminal that is coupled to the tail node, and a gate terminal that receives common mode sensing voltage Vcm_vga via path 498. Similarly, transistor 410 may have a drain terminal that is coupled to power supply terminal 404 via load transistor 414, a source terminal that is coupled to the tail node, and a gate terminal receives reference voltage Vcm_ref. The drain terminal of transistor 410 is sometimes considered to be the output node of single-stage amplifier 400.

Transistor 412 may have a source terminal that is coupled to power supply terminal 404, a drain terminal that is coupled to the drain terminal of transistor 408, and a gate terminal that is coupled to its own drain terminal (e.g., transistor 412 may be configured in a diode connection). Transistor 414 may have a source terminal that is coupled to power supply terminal 404, a drain terminal that is coupled to the drain terminal of transistor 410, and a gate terminal that is shorted to the gate terminal of transistor 412.

Biasing circuit 490 may include a p-channel transistor 416 and n-channel transistors 418 and 420 coupled in series between power supply line 404 and ground line 402. P-channel transistor 416 may have a gate that is coupled to the drain terminal of transistor 410. N-channel transistor 418 may have a gate terminal that is coupled to path 498, whereas n-channel transistor 420 has a gate terminal that is shorted to the gate terminal of tail transistor 406 and the drain terminal of transistor 418. Configured in this arrangement, transistor 416 mirrors a fraction of the amplifier bias current that flows through amplifier 400, and as a result, operational amplifier 312 is sometimes considered to be a self-biased operation amplifier. Because amplifier 312 is self-biased, amplifier 312 is able to maintain is performance over different operating conditions (e.g., over different process, temperature, and voltage levels), and a separate biasing circuit is not required. Transistor 418 serves to ensure that the drain voltages of transistor 420 and 406 are comparable so that the difference in source-drain voltage in the pull-down current mirror (i.e., the current mirror between transistors 406 and 420) is minimized.

Output stage 492 may include a p-channel transistor 430 having a source terminal that is coupled to power supply line 430, a gate terminal that is coupled to the output node of amplifier 400, and a drain terminal on which voltage Vcc_vga is provided. In general, operational amplifier 312 may be a two pole linear system. To ensure stability of this two pole common mode feedback system, miller compensation circuitry such as a miller capacitor Cm and a miller resistor Rm may be coupled in series between the drain and gate terminals of transistor 410 in the output stage 492.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit, comprising:
 a differential amplifier having a power supply terminal and an output;
 an operational amplifier having an input that receives a common mode sensing voltage from the output of the differential amplifier and an output that is connected to the power supply terminal of the differential amplifier;
 a digital sampler that receives signals from the output of the differential amplifier and that has an output;
 a digital flip-flop that receives signals from the output of the digital sampler and that has an output; and
 a summation node circuit that is coupled to the output of the differential amplifier and that has a first input that is coupled to the output of the digital sampler, a second input that is coupled to the output of the digital flip-flop, and an output that is coupled to an input of the digital sampler.

2. The integrated circuit defined in claim 1, wherein the operational amplifier further includes an additional input that receives a reference voltage.

3. The integrated circuit defined in claim 2, further comprising:
a voltage regulator that generates the reference voltage for the operational amplifier.

4. The integrated circuit defined in claim 1, wherein the differential amplifier comprises part of an equalizer circuit.

5. The integrated circuit defined in claim 1, wherein the operational amplifier comprises a self-biased operational amplifier.

6. An integrated circuit, comprising:
a first amplifier having an output;
a digital sampler that receives signals from the output of the first amplifier; and
a second amplifier that senses a common mode voltage level from the output of the first amplifier and provides a corresponding output that ensures that the common mode voltage level is within a predetermined range of voltage levels, wherein the second amplifier has a first input that receives the common mode voltage level from the output of the first amplifier and a second input that receives a fixed reference voltage level.

7. The integrated circuit defined in claim 6, wherein the first amplifier further includes a power supply terminal, and wherein the output of the second amplifier is provided to the power supply terminal of the first amplifier.

8. The integrated circuit defined in claim 6, wherein the first amplifier comprises a differential amplifier.

9. The integrated circuit defined in claim 6, further comprising:
a summation node circuit coupled to the output of the first amplifier, wherein the summation node circuit has an input, and wherein the digital sampler has an output that is fed back to the input of the summation node circuit.

10. The integrated circuit defined in claim 9, wherein the summation node circuit has an additional input, further comprising:
a digital flip-flop that is coupled to the output of the digital sampler and that has an output that is fed back to the additional input of the summation node circuit.

11. An integrated circuit, comprising:
a differential amplifier having a common mode output voltage level; and
a self-biased operational amplifier that receives a reference voltage level and that ensures that the common mode output voltage level of the differential amplifier matches with the received reference voltage level, wherein the self-biased operational amplifier comprises:
a single-ended amplifier that includes an input transistor; and
a biasing circuit that receives the common mode output voltage level from the differential amplifier and that biases the single-ended amplifier via a current mirroring configuration, wherein the biasing circuit includes first and second transistors connected in series, and wherein the first transistor and the input transistor have gates that are shorted to one another.

12. The integrated circuit defined in claim 11, wherein the single-ended amplifier further includes a tail transistor and wherein the second transistor and the tail transistor have gates that are shorted to one another.

13. The integrated circuit defined in claim 11, wherein the self-biased operational amplifier further comprises:
an output stage having miller compensation circuitry.

14. The integrated circuit defined in claim 11, wherein the differential amplifier and the self-biased operational amplifier form part of transceiver circuitry on the integrated circuit.

15. The integrated circuit defined in claim 11, wherein the differential amplifier and the self-biased operational amplifier form part of a decision feedback equalizer (DFE) circuit on the integrated circuit.

\* \* \* \* \*